United States Patent [19]
Arjomand

[11] Patent Number: 5,884,202
[45] Date of Patent: *Mar. 16, 1999

[54] MODULAR WIRELESS DIAGNOSTIC TEST AND INFORMATION SYSTEM

[75] Inventor: Hossein Arjomand, San Jose, Calif.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 504,935

[22] Filed: Jul. 20, 1995

[51] Int. Cl.⁶ .......................... G01M 15/00; G01R 31/00
[52] U.S. Cl. .......................... 701/29; 701/33; 701/35; 340/439; 340/825.69
[58] Field of Search ................... 701/29, 33, 35; 73/117.2, 117.3, 118.1; 307/10.1, 10.2; 340/438, 439, 825.69, 459, 825.72; 345/2, 173; 364/424.034, 424.038, 424.04

[56] References Cited

U.S. PATENT DOCUMENTS

| | | | |
|---|---|---|---|
| 4,113,980 | 9/1978 | Bell | 73/117.2 |
| 4,270,174 | 5/1981 | Karlin et al. | 701/115 |
| 4,404,639 | 9/1983 | McGuire et al. | 364/424.04 |
| 4,441,359 | 4/1984 | Ezoe | 364/424.037 |
| 4,602,127 | 7/1986 | Neely et al. | 379/68 |
| 4,853,850 | 8/1989 | Krass, Jr. et al. | 364/424.04 |
| 4,962,456 | 10/1990 | Abe et al. | 364/431.01 |
| 5,157,610 | 10/1992 | Asano et al. | 701/32 |
| 5,160,892 | 11/1992 | Makhija et al. | 324/379 |
| 5,373,458 | 12/1994 | Bishay et al. | 364/708.1 |
| 5,442,553 | 8/1995 | Parrillo | 701/35 |
| 5,465,207 | 11/1995 | Boatwright et al. | 364/424.081 |
| 5,506,772 | 4/1996 | Kubozono et al. | 701/29 |
| 5,521,443 | 5/1996 | Imura et al. | 307/10.2 |
| 5,532,927 | 7/1996 | Pink et al. | 701/34 |
| 5,541,840 | 7/1996 | Gurne et al. | 364/424.038 |
| 5,583,912 | 12/1996 | Schillaci et al. | 379/21 |
| 5,592,383 | 1/1997 | Rogers et al. | 701/29 |
| 5,758,300 | 5/1998 | Abe | 701/33 |

Primary Examiner—Tan Q. Nguyen

[57] ABSTRACT

A computer-based apparatus provides access to complex technical information needed, for example, to maintain and repair complicated equipment, such as a motor vehicle. The apparatus includes a combined user interface and main control module to communicate with at least one remotely operated instrumentation module to control and obtain data by wireless communication. The combined user interface and main control module has an interactive display which enables the user to command the functions of the remotely deployed instrumentation module(s) and enter data through interaction with the display, as well as executes diagnostic application programs and displays information to the user. Alternatively, a separate user interface module and main control module connected by wireless communication can be provided, in which the user interface module not only commands the functions of the instrumentation module(s), but also commands remote execution of diagnostic application programs by the main control module.

27 Claims, 12 Drawing Sheets

MODULAR WIRELESS DIAGNOSTIC TEST AND INFORMATION SYSTEM

BACKGROUND OF THE INVENTION

The present invention relates in general to test equipment and, more particularly, to diagnostic, test, and information systems. Specifically, one embodiment of the invention is directed to a modular wireless diagnostic, test, and information system comprising a combined user interface and main control module and at least one remotely controlled instrumentation module connected by wireless communication. The combined user interface and main control module has an interactive display which enables the user to command the functions of the remotely deployed instrumentation module(s) and enter data through interaction with the display, as well as executes application programs and displays information to the user. For example, one embodiment of the invention provides a combined user interface and main control module having an interactive display, in which the user interacts with the display to access complex technical information employed to maintain and repair a motor vehicle and to control the instrumentation module(s) over a wireless communication link in the form of a radio-frequency (RF) local area network (LAN) to perform measurements on the vehicle, as well as to execute diagnostic routines and to display information to the user. Such a modular wireless motor vehicle diagnostic, test, and instrumentation system is particularly useful to provide information about a motor vehicle and vehicle diagnostics to the user during maintenance or repair of the vehicle.

Although the modular wireless diagnostic, test, and information system in accordance with the invention is susceptible to being used in various applications, it has been found to be particularly advantageous for use in the maintenance and repair of motor vehicles. Therefore, an embodiment of the modular wireless diagnostic, test, and information system in accordance with the invention will be described in connection with service of a motor vehicle. However, it is to be understood that the invention is not limited to motor vehicle maintenance and repair and may also be applicable to non-motor-vehicle applications.

Today, there are various handheld testers used in connection with the maintenance and repair of motor vehicles. Typically, these testers comprise cables attached to a microprocessor-based handheld device. The cables, for example, include a cable that connects to the motor vehicle battery and another cable that connects to an electrical system or component of the motor vehicle to measure voltage and current, as well as a data cable that connects to the engine control module to transmit information about operation of the vehicle to the handheld tester or to enable the tester to control various motor vehicle functions. See, for example, Tech 1, "Cartridges and Accessories," September, 1989.

Unfortunately, the cables connected to the motor vehicle are typically heavy and stiff. Consequently, the handheld tester is unwieldy to operate, which is inconvenient for the user. Furthermore, the display screen on the handheld tester is typically small, and, therefore, only a minimal amount of information can be displayed to the user.

Regarding the display of information to the user, the trend in the motor vehicle service bay is toward greater access to information relating to maintenance and repair. This trend requires the user to have a larger display screen incorporated into his or her test equipment and many connections to the motor vehicle, as well as to a dealership local area network (LAN).

Historically, motor vehicle manufacturers have provided printed information regarding maintenance and repair. As a service to motor vehicle maintenance and repair personnel, the manufacturers provided published information, such as manuals, for reference during maintenance and repair of motor vehicles. However, published information requires a large amount of storage space.

More recently, motor vehicle manufacturers have provided maintenance and repair information on microfiche which is periodically updated. Although microfiche reduces storage requirements, microfiche can be misfiled, and microfiche readers are cumbersome to use.

Today, various computer-based systems exist for providing motor vehicle maintenance and repair information. Some of these computer-based systems also comprise instruments to perform measurements in connection with motor vehicle evaluation and diagnosis. For example, one such computer-based system is the Model HP 27070B ("TestBook"), available from Hewlett-Packard Company, Palo Alto, Calif.. See, "HP TestBook," Hewlett-Packard Company Part No. 5091-9697E, September, 1993.

The TestBook system is a portable integrated personal computer and test system that provides a compact mobile test and information tool for use in the motor vehicle service bay or on a road test. The TestBook system comprises a 486-microprocessor-based personal computer, an integrated adjustable VGA liquid crystal display (LCD) panel and touchscreen interactive user interface having a capacitive touch-activated screen, and a built-in CD-ROM drive to provide faster and easier access to the latest service procedures and information for maintenance and repair of a motor vehicle. Built-in measurement instrumentation and a programmable communications interface offer a test capability for computer-aided diagnostic applications. The TestBook system can be custom-configured to meet various MS-DOS, Windows, or OS/2 application requirements.

While the TestBook system provides ready access to a large amount of information needed for maintenance and repair of a motor vehicle, cables that connect to the vehicle must be attached to the measurement instrumentation integrated into the system. Consequently, as in the case of handheld testers, the TestBook system is unwieldy and is typically set on a work surface, such as a workbench or tool chest, during use. Therefore, the user does not have ready access to the integrated interactive display of the TestBook system while he or she is under the hood of the motor vehicle.

Additionally, a test and information tool for maintenance and repair of a motor vehicle, which has a selectively detachable, remotely operated interactive display unit that controls a portable integrated personal computer and test system is disclosed in co-pending U.S. patent application Ser. No. 08/421,591, filed on Apr. 12, 1995, and assigned to the same assignee as the present application. This motor vehicle test and information tool provides greater user mobility than the TestBook system, because the display unit is not encumbered by being integrated with the personal computer having the additional weight of measurement instrumentation tethered by cables connected to electrical systems and components, as well as the engine control module, of the motor vehicle.

However, the measurement instrumentation is integrated with the personal computer, which requires a specially designed housing to accommodate both the personal computer and measurement instrumentation. The integrated personal computer and measurement instrumentation must also meet environmental and safety requirements relating to test equipment used in a motor vehicle service bay.

It is therefore desirable to provide a system to facilitate access to information by a user during maintenance and repair of a motor vehicle. Additionally, it would be desirable to enable the user to control the display of information about maintenance and repair of a motor vehicle and perform needed measurements, as well as display information to the user, while he or she is under the hood of the vehicle. It would be further desirable to have an interactive information display and control system that is not encumbered by cables connected to the motor vehicle. Also, it would be desirable to have a diagnostic, test, and information system that is easily scalable by the selection of any desired amount of measurement instrumentation. Furthermore, it would be desirable to provide a diagnostic, test, and information system which minimizes both the number of specially designed components and the number of components subjected to the harsh environment and safety requirements for equipment used in a motor vehicle service bay.

SUMMARY OF THE INVENTION

One embodiment of the invention provides a modular wireless diagnostic, test, and information system that comprises wireless networked modules. The wireless networked modules include means comprising a combined user interface and main control module that provides information to a user. The wireless networked modules also include at least one remotely operated instrumentation module to perform various measurements and/or provide data under command of the user interface and main control module. In another embodiment, there is a user interface module and a separate main control module, and the user interface module commands the remotely operated main control module to execute diagnostic routines and displays information provided by the main control module to the user by wireless communication. Although the modular wireless diagnostic, test, and information system having the user interface and combined or separate main control module and remotely operated measurement instrumentation modules can be used for maintenance and repair of a given type of complex equipment, such as a motor vehicle, it is also contemplated that the system in accordance with the invention can be generalized to access information and command functions by wireless communication, as well as display information, necessary to assist other service providers (such as equipment operators, doctors, and others) in providing services.

In accordance with one embodiment of the invention, the combined user interface and main control module provides information and can perform other functions, for example, execute a motor vehicle maintenance and repair application program that accesses motor vehicle maintenance and repair information. The remotely operated instrumentation modules preferably comprise instruments, such as a digital volt-ohm meter (DVOM) module connected to a motor vehicle, for performing measurements. The instrumentation modules also comprise a vehicle communication interface (VCI) instrumentation module connected to the engine control module of a motor vehicle. The unique attribute of this embodiment of the invention is that the combined user interface and main control module is provided with an interactive display that commands the remotely operated instrumentation module(s) over a wireless communication link, for example, a radio-frequency (RF) local area network (LAN), as well as to display information to the user.

In accordance with another embodiment of the invention, the user interface module is a separate handheld, lightweight module having an integrated user input digitizer, such as a touchscreen or pen interface. The user interface module communicates with a separate remotely operated main control module by wireless communication. The main control module has mass storage devices that provide volumes of information stored for communication to the user interface module. The main control module executes diagnostic routines and transmits diagnostics and information about a motor vehicle under evaluation or repair to the user interface module. Therefore, the user interface module having the interactive display is remotely operated with respect to the main control module so that the user has greater mobility. If the user interface module were not a separate remotely operated module, the user would be required to carry the additional weight of the mass storage devices integrated into the main control module. Additionally, the remotely operated instrumentation module(s) are connected to both the user interface module and the main control module by wireless communication and are not tethered to either the user interface module or the main control module by cables. All connections to the motor vehicle are to the instrumentation modules(s) to provide electrical isolation. Also, the main control module can be a commercially available personal computer system located in an office environment and does not require customization for integration of measurement instrumentation or need to be configured to withstand the harsh environment of a motor vehicle service bay.

The only required user interface to operate the combined or separate user interface module and the main control module is through the interactive display. With this user interface module configuration, the user has full mobility to work in and around a motor vehicle without having to manage numerous cables. Also, the combined or separate user interface module can be provided with a tilt stand and/or hanger selectively secured to the user interface module so that the user interface module can be set on or hung from the hood or other features of a motor vehicle. This frees the hands of the user to perform other tasks.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings.

Figure 1:
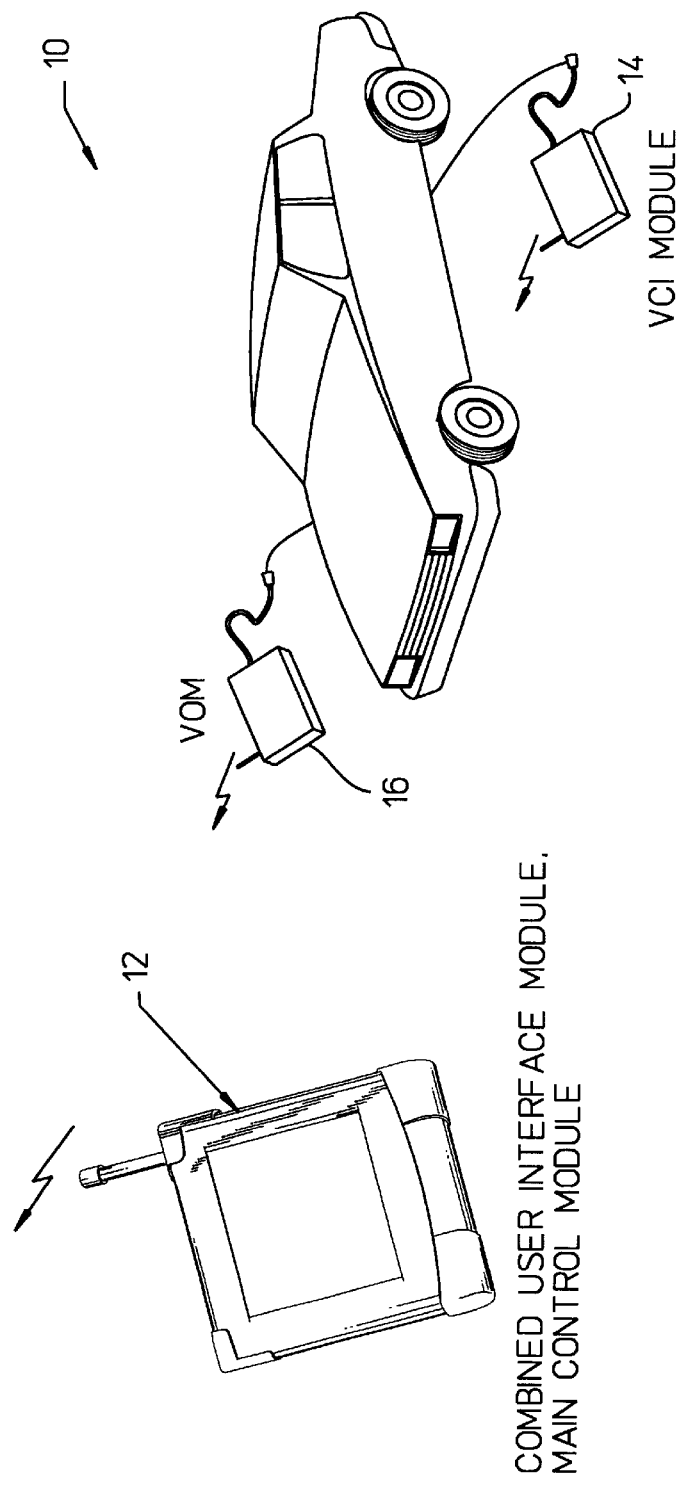
FIG. 1 is a block diagram of one embodiment of the modular wireless diagnostic, test, and information system comprising a combined user interface and main control module and at least one remotely operated instrumentation module connected by wireless communication in accordance with the invention.
Figure 7:
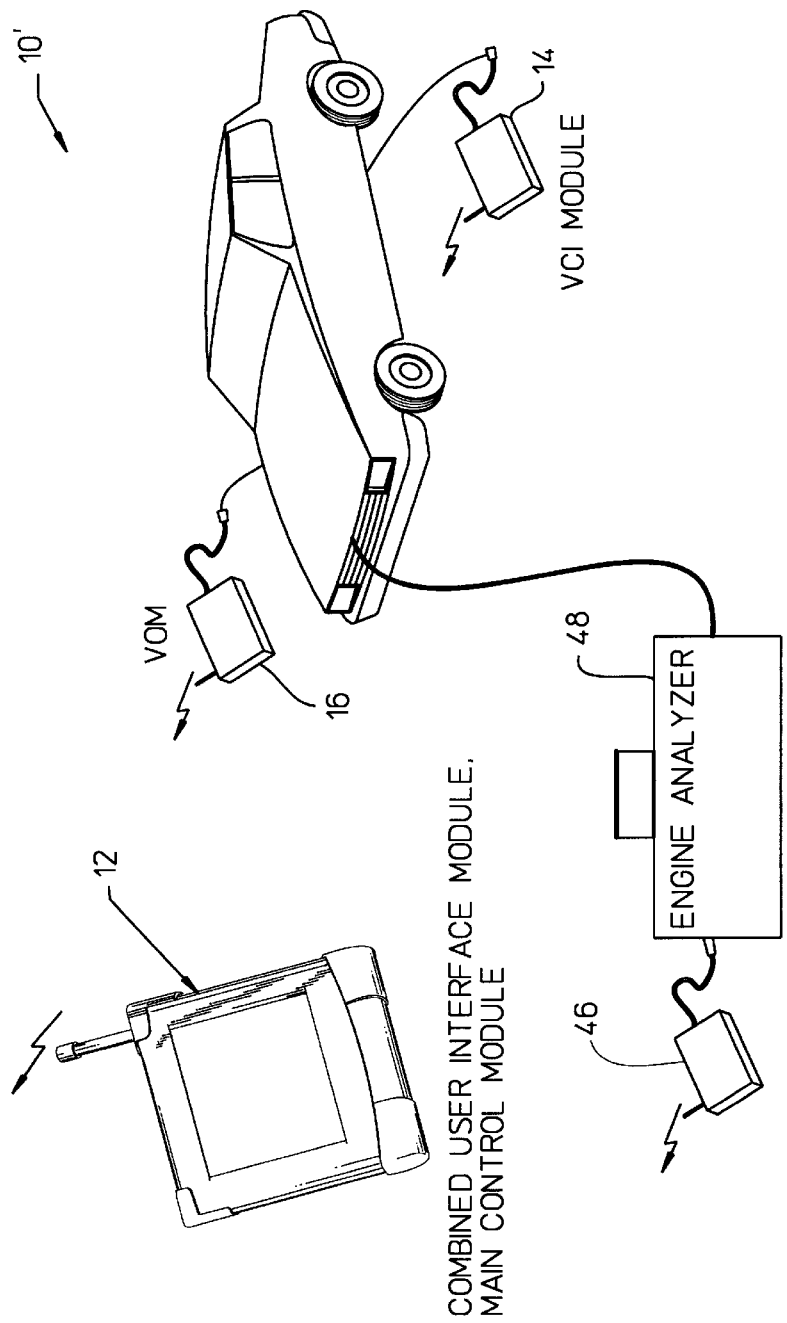
FIG. 7 is a block diagram of the modular wireless diagnostic, test, and information system shown in FIG. 1 further comprising an additional remotely operated instrumentation module consisting of an interface module and engine analyzer.
Figure 8:
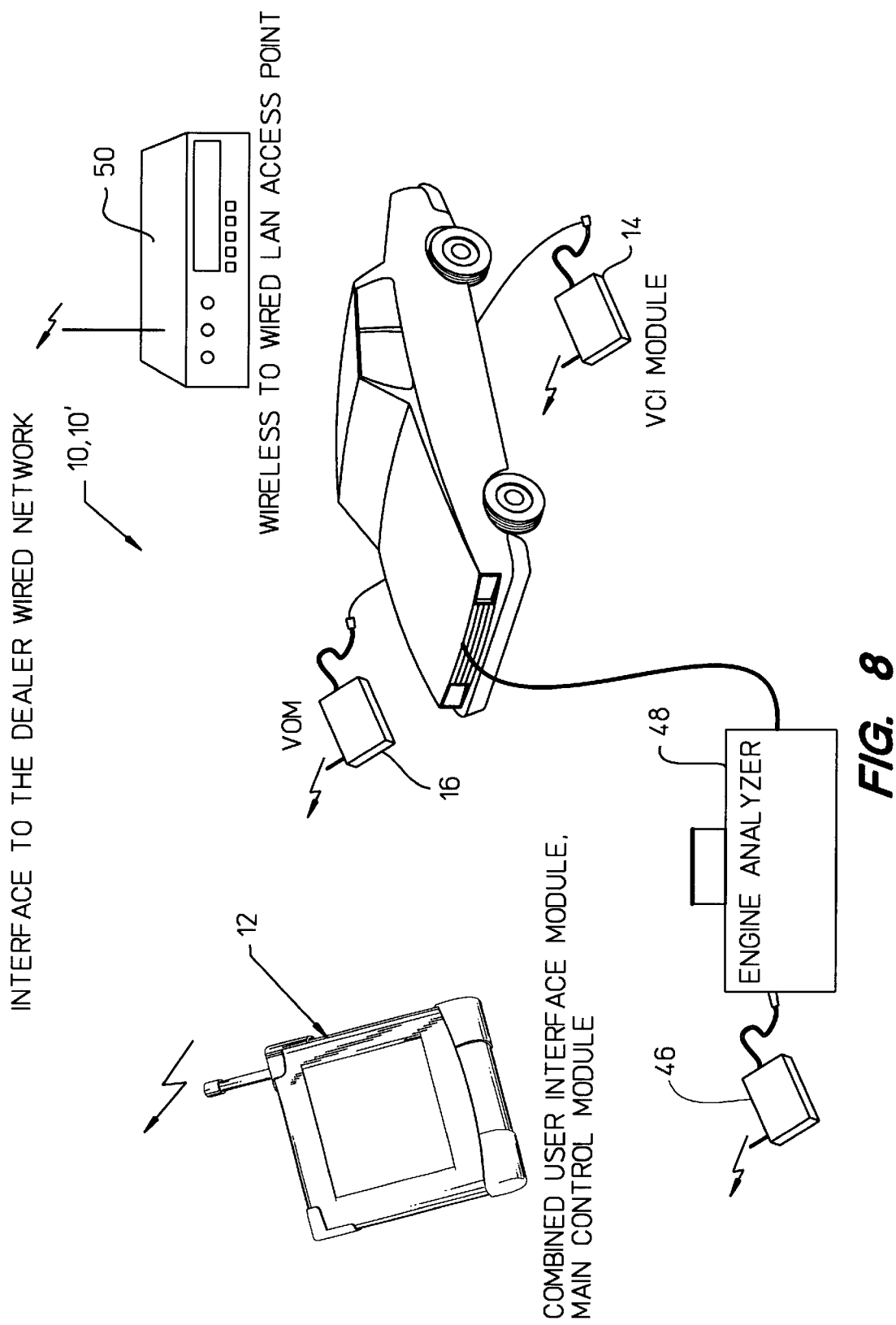
Figure 9:
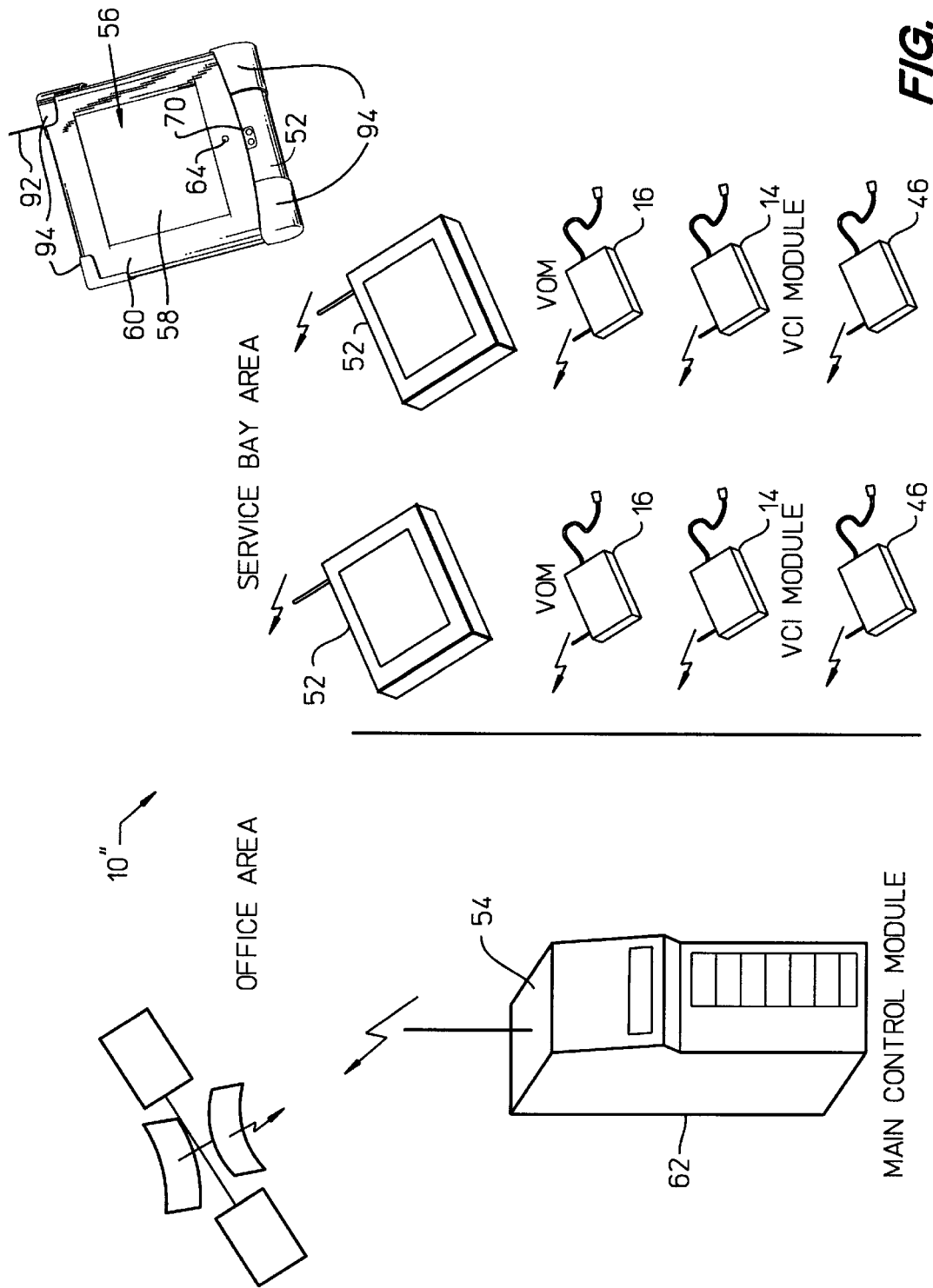
Figure 10:
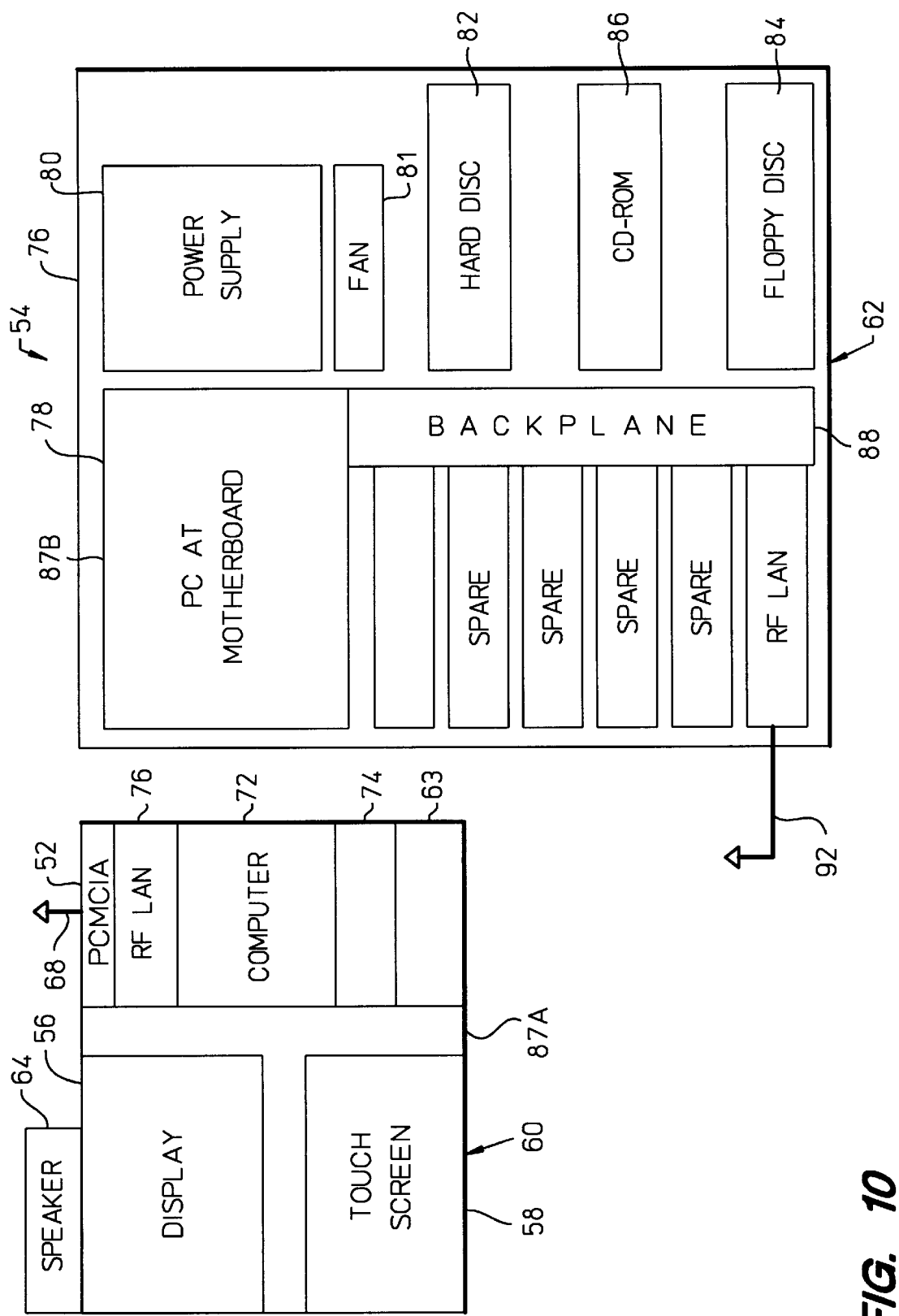
Figure 11:
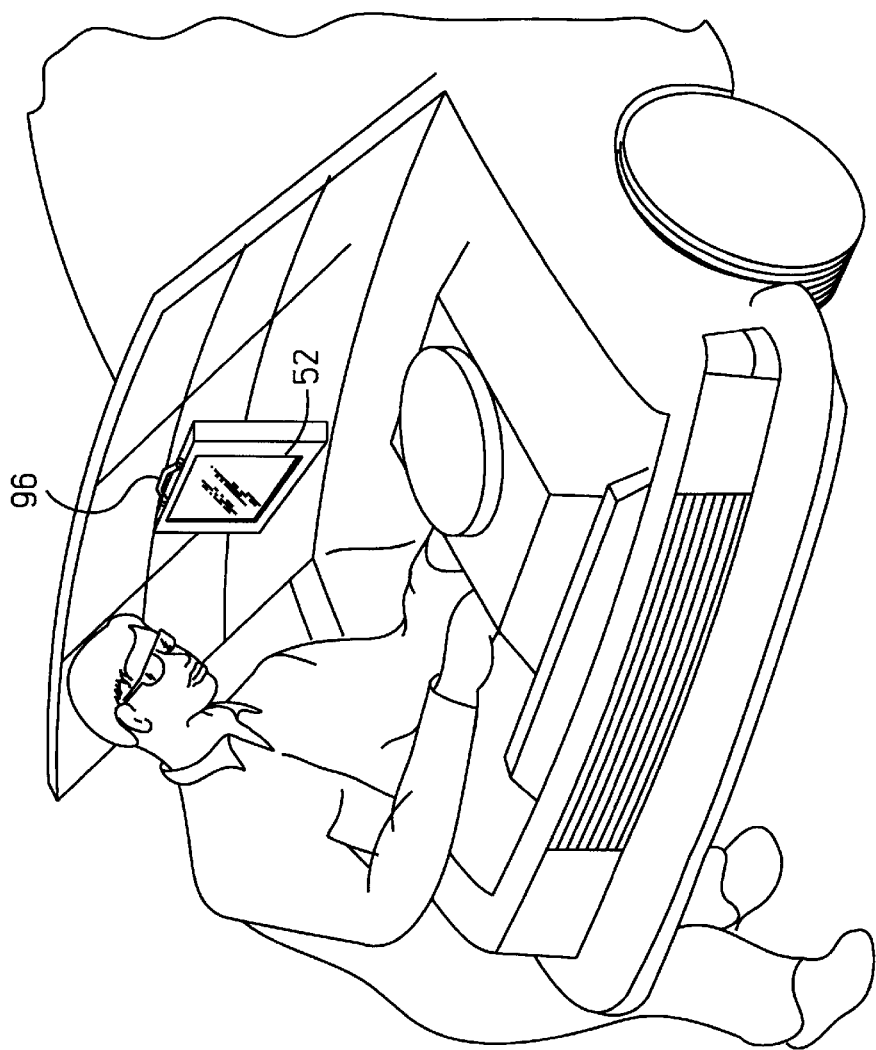

FIG. 8 is a block diagram of the modular wireless diagnostic, test, and information system shown in FIG. 1 or 7 further comprising a wireless-to-wired local area network (LAN) access system;

FIG. 9 is a block diagram of another embodiment of the modular wireless diagnostic, test, and information system comprising a separate user interface module, a separate remotely operated main control module, and at least one remotely operated instrumentation module connected by wireless communication in accordance with the invention;

FIG. 10 shows one implementation of the separate user interface module and the separate main control module of the system shown in FIG. 9;

FIG. 11 illustrates an exemplary deployment of the system shown in FIG. 9; and

Figure 12:
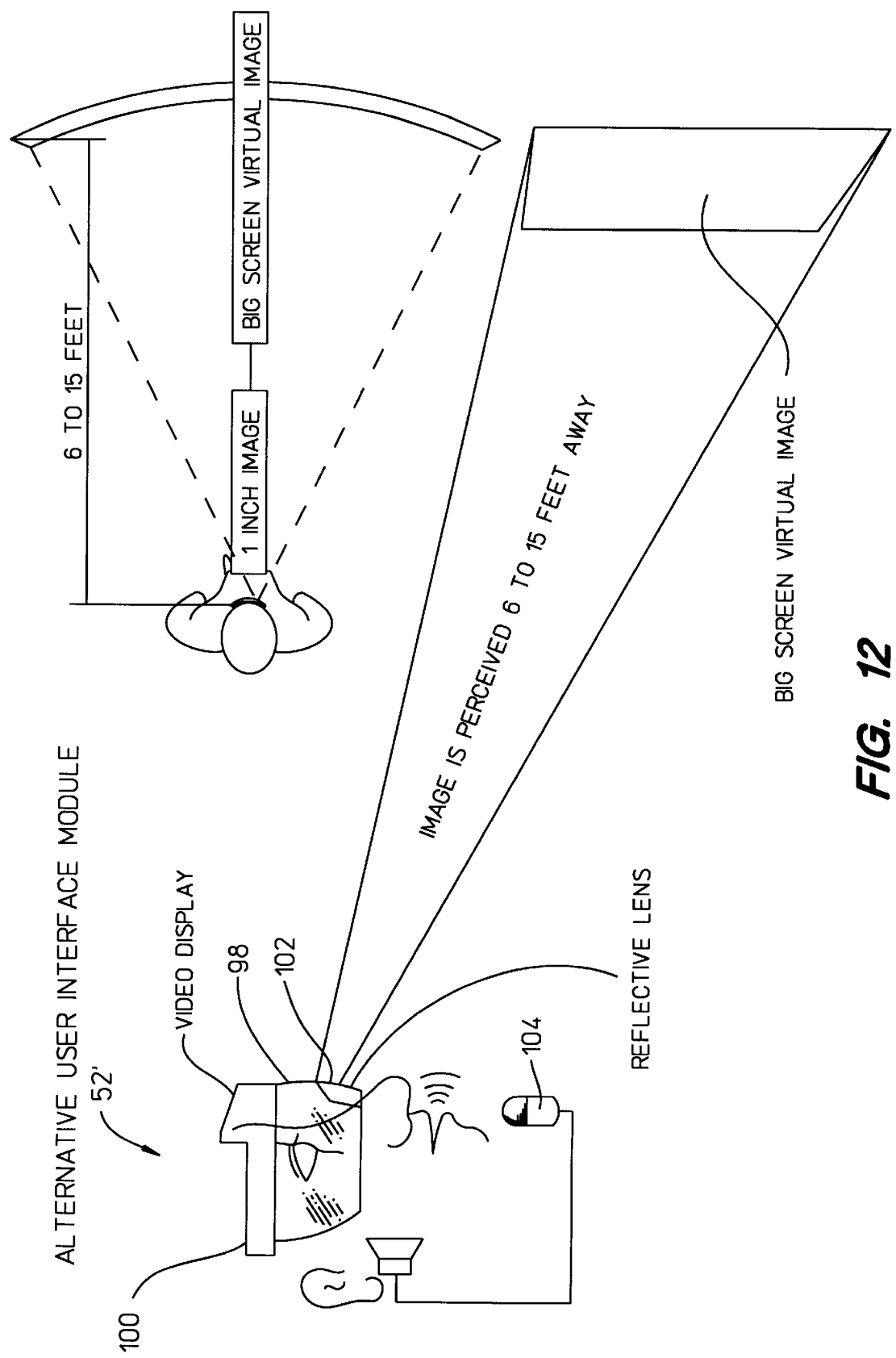

FIG. 12 shows an alternative implementation of the separate user interface module of the system shown in FIG. 9.

DETAILED DESCRIPTION OF THE PREFERRED EMBODIMENTS

One embodiment of the modular wireless diagnostic, test, and information system in accordance with the invention, generally indicated by the numeral 10, is shown in FIG. 1. The system 10 comprises means in the form of a combined user interface and main control module 12. The system 10 also comprises at least one instrumentation module deployed remotely with respect to the combined user interface and main control module 12, for example, a vehicle communication interface (VCI) instrumentation module 14. As shown in FIG. 1, the system 10 also preferably comprises a digital volt-ohm meter (DVOM) instrumentation module 16. As shown in FIG. 1, the combined user interface and main control module 12 and the VCI and DVOM instrumentation modules 14 and 16 are connected by wireless communication.

Figure 2:
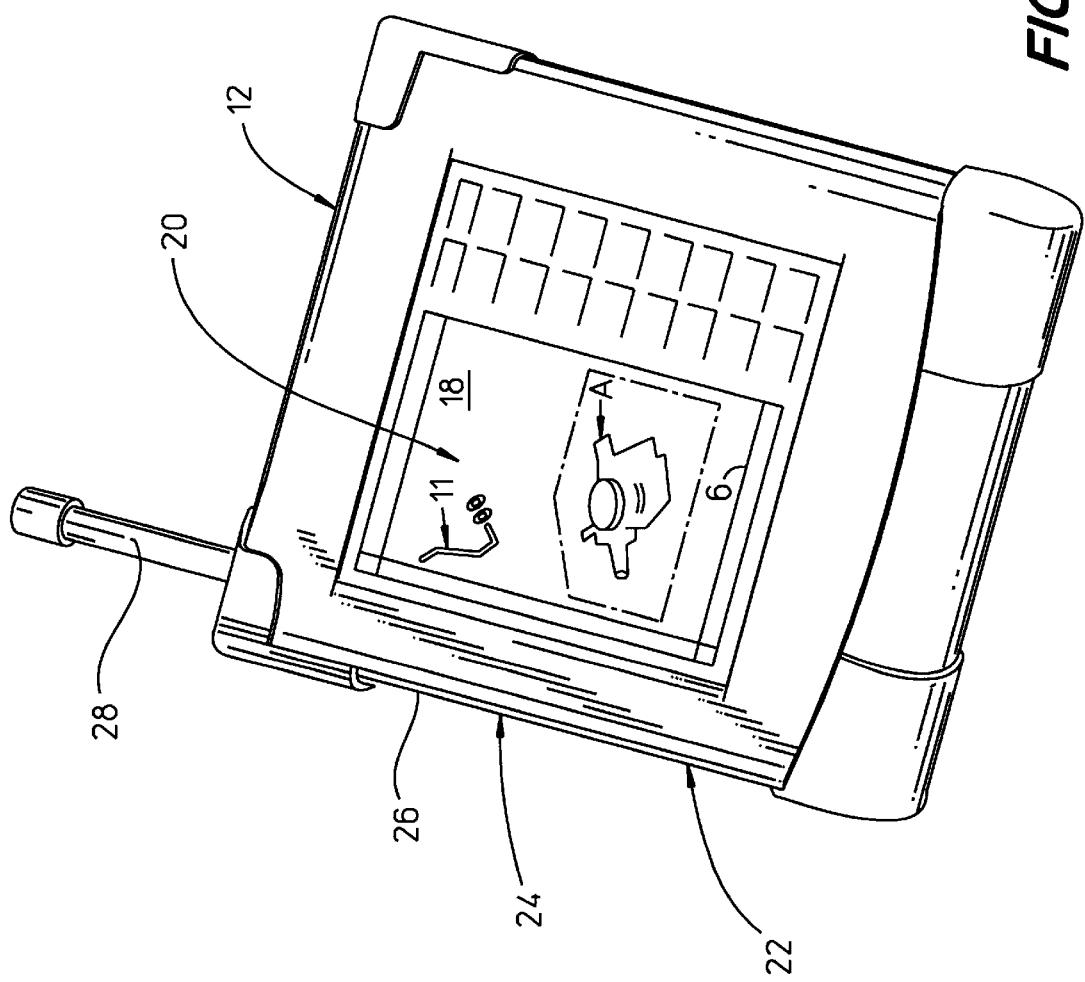
FIG. 2 is a perspective view of one exemplary implementation of the combined user interface and main control module included in the system shown in FIG. 1.

As shown in FIGS. 1 and 2, the combined user interface and main control module 12 is an intelligent sub-system comprising its own on-board personal computer system. The combined user interface and main control module 12 is the user interface to the system 10. The combined user interface and main control module 12 provides the user with any or all visual, audible, and/or tactile means by which to communicate to the remainder of the system 10. The combined user interface and main control module 12 provides information to the user and receives commands from the user to process or communicate to the VCI instrumentation module 14 and/or the DVOM instrumentation module 16 by wireless communication.

The combined user interface and main control module 12 can be supplied with power from a rechargeable internal battery power source or from an external power source if the internal power source develops a low battery condition. For example, in the exemplary application in which the system 10 is used for maintenance and repair of a motor vehicle, the combined user interface and main control module 12 can be connected to the vehicle battery (not shown).

In one exemplary implementation, the combined user interface and main control module 12 can be a VERSA PAD battery-operated computer tablet, available from NEC. Alternatively, the computer tablet can be powered from a motor vehicle battery (not shown).

The VERSA PAD computer tablet has an LCD panel 18, a pen-based user input digitizer 20, and a user interface device driver (UIDD) 22 to capture the user interface information and provide display and speaker information. The combined user interface and main control module 12 further comprises built-in PCMCIA ports 24. Additionally, the combined user interface and main control module 12 comprises a standard PCMCIA radio-frequency (RF) local area network (LAN) card 26, available from PROXIM, inserted into one of the PCMCIA ports 24. The combined user interface and main control module 12 also comprises an RF antenna 28.

The software environment for the system 10 is preferably a windows-based software interface, such as Microsoft Windows 1995 (Chicago). Also, the system 10 is capable of running MS-DOS 6/Windows 3.1 and Windows NT.

Figure 4:
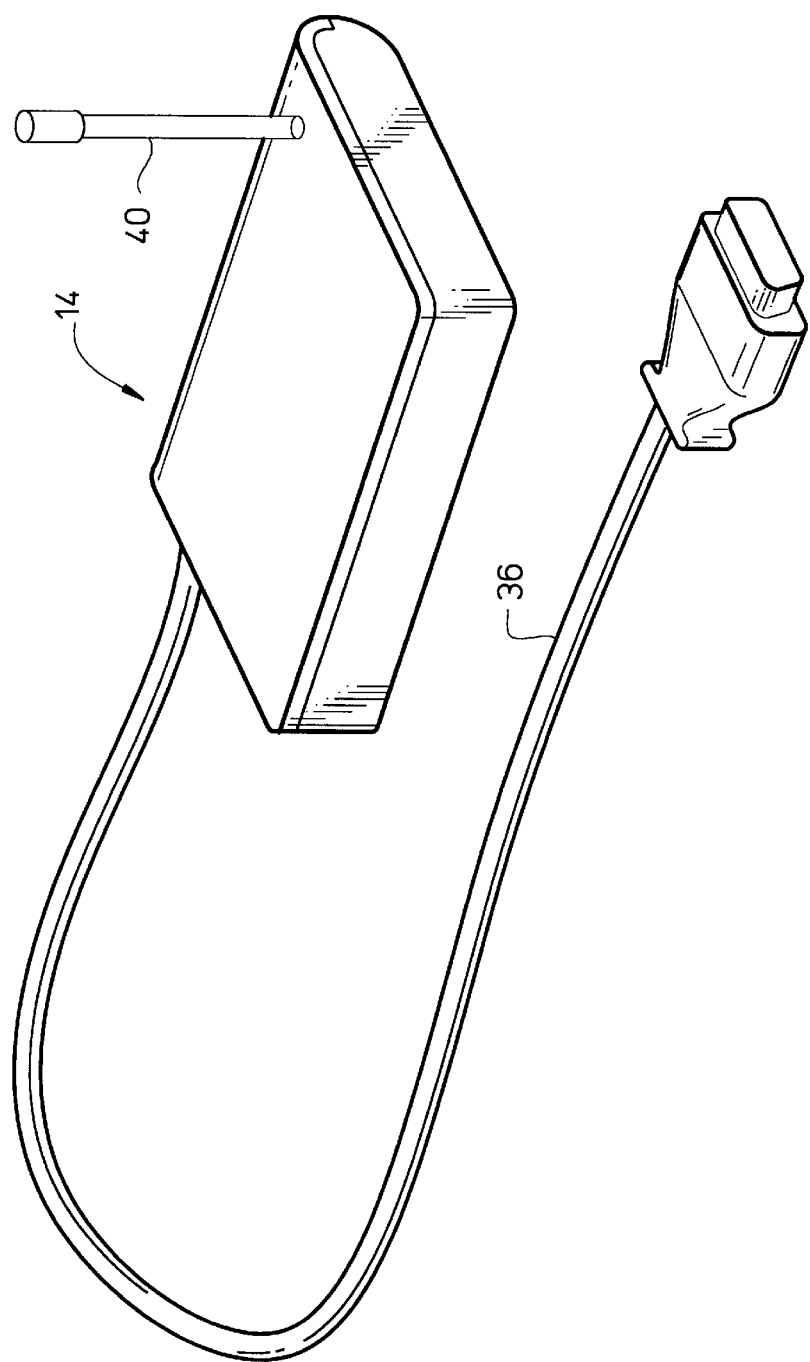
FIG. 4 is a perspective view of one exemplary implementation of a vehicle communication interface (VCI) instrumentation module included in the system shown in FIG. 1.
Figure 5:
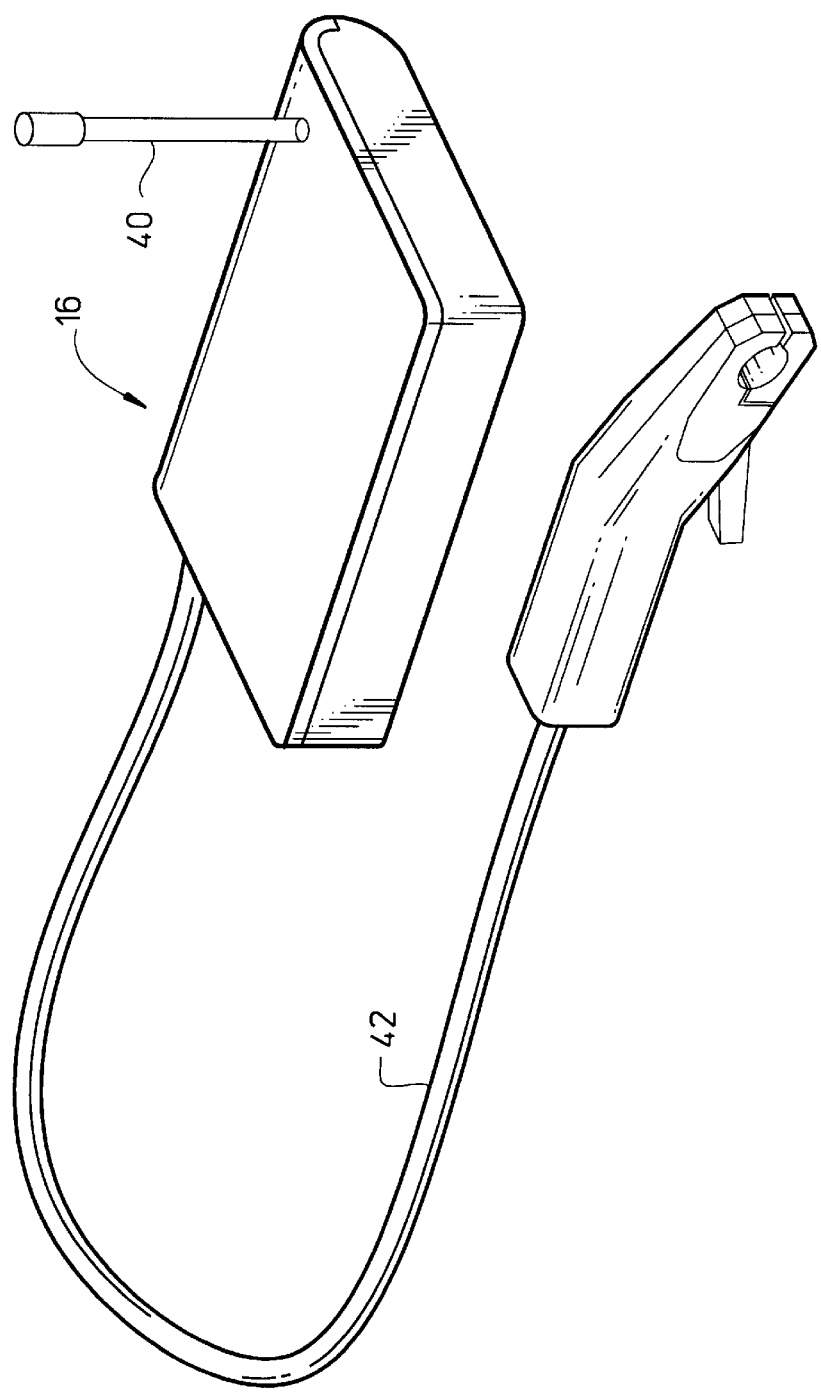
FIG. 5 is a perspective view of one exemplary implementation of a digital volt-ohm meter (DVOM) instrumentation module included in the system shown in FIG. 1.

The system 10 also comprises all instruments to perform measurements. As shown in FIGS. 1 and 4, in the case of motor vehicle maintenance and repair, the system 10 comprises the VCI instrumentation module 14 which provides a bi-directional data communications link between an engine control module of a motor vehicle, that is, the vehicle on-board computer, and the combined user interface and main control module 12. As shown in FIGS. 1 and 5, the system 10 also comprises the DVOM instrumentation module 16 to which are connected various cables from the electrical systems or components of a motor vehicle for measurement of voltages and currents needed to be measured in connection with evaluation and diagnosis of a vehicle.

Figure 3:
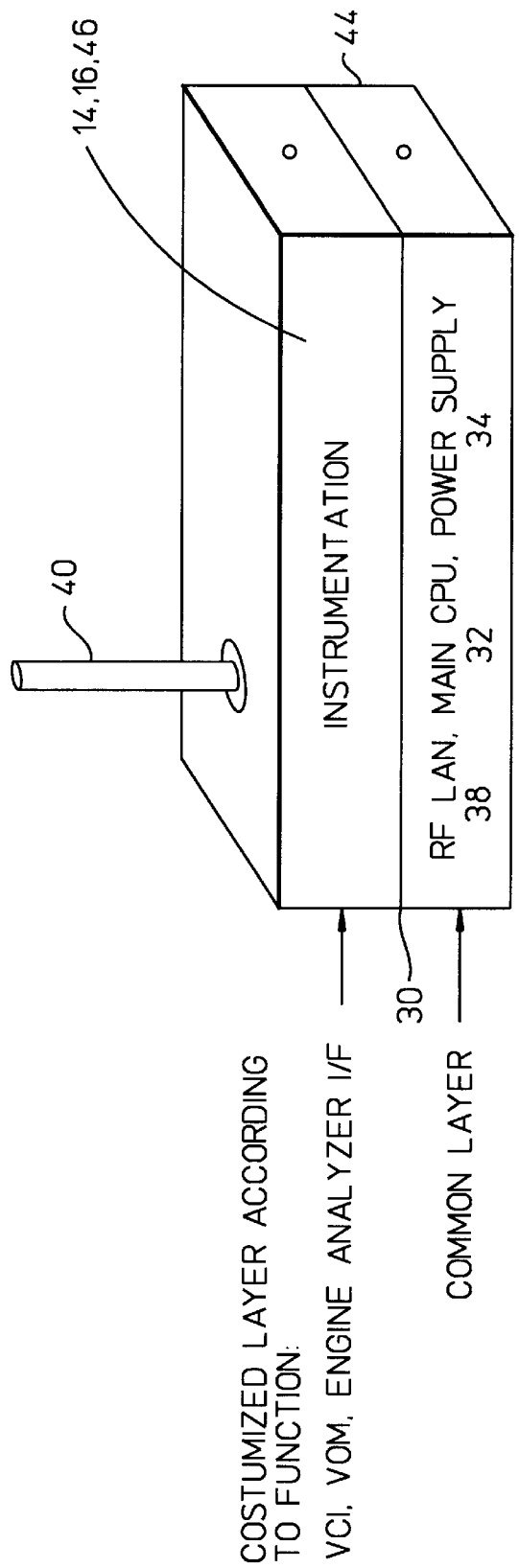
FIG. 3 is a block diagram of an instrumentation module included in the system shown in FIG. 1.

As shown in FIGS. 3–5, each measurement instrumentation module preferably comprises a standard data acquisition interface. There are preferably two instrumentation modules that provide data acquisition interfaces. One of the interfaces is provided by the VCI instrumentation module 14, and the other is provided by the DVOM instrumentation module 16. Each of the interfaces is a standard interface 30 that can be replaced or upgraded.

The VCI instrumentation module 14, as well as the DVOM instrumentation module 16, are implemented on respective plug-in I/O cards. The respective card for the VCI and DVOM instrumentation module 14 or 16 resides on a main CPU motherboard 32 plugged into an expansion slot or connector. The VCI instrumentation module 14 and the DVOM instrumentation module 16 are preferably controlled by respective dedicated microcontrollers.

The card which comprises the VCI instrumentation module 14 has an isolated analog/digital input stage to isolate the vehicle communication interface of the main CPU motherboard 32 from the electrical system of the motor vehicle. The card which comprises the DVOM instrumentation module 16 has an isolated analog input stage to isolate the remainder of the DVOM instrumentation module from the motor vehicle electrical system.

Each of the VCI and DVOM instrumentation modules 14 and 16 also comprises a power supply 34. In the case of the VCI instrumentation module 14, the motor vehicle battery provides power through a VCI cable 36 shown in FIG. 4. An internal rechargeable battery power source (not shown) is preferably included in the DVOM instrumentation module 16 to provide power for the power supply 34. The power supply 34 comprises a DC-to-DC converter which isolates the main CPU motherboard 32 from the motor vehicle power and ground connections. The VCI and DVOM instrumentation modules 14 and 16 are provided with cooling vents (not shown) having filters (not shown) to the ambient surroundings to prevent overheating. Additionally, each of the VCI and DVOM instrumentation modules 14 and 16 comprises an RF LAN card 38, also available from PROXIM, installed in the expansion slot or connector on the main CPU motherboard 32 and an RF antenna 40.

The card for the VCI instrumentation module 14 is generally custom to each application, so its configuration will not be described in detail. The card for the DVOM instrumentation module 16 will now be described in more detail.

As indicated earlier, the DVOM circuit preferably resides on the main CPU motherboard 32 of the DVOM instrumentation module 16. The DVOM circuit interfaces to a 486 microprocessor system of the main CPU motherboard 32 of the DVOM instrumentation module 16 via the expansion slot or connector. As shown in FIG. 5, connection to a motor vehicle is provided by a multi-conductor connector of approximately 15 pins which mate with a matching roving probe cable assembly 42.

In one implementation, the card which comprises the DVOM instrumentation module 16 can be a Model HP Z1062-60002 DVOM card, available from Hewlett-Packard Company. This DVOM card is an intelligent 68HC16 microcontroller-based sub-system. Firmware for the DVOM measurement instrument is preferably stored in a flash EPROM.

The card which comprises the DVOM instrumentation module 16 preferably comprises a high-density DB15 signal connector for analog probes. The DVOM card additionally comprises an electrically isolated serial port.

The DVOM circuit comprises one channel for data acquisition for a measurement. The DVOM circuit comprises a fast analog-to-digital converter (ADC). The DVOM circuit provides an electrically isolated analog measurement interface having a high input impedance so that the data acquisition channel is electrically isolated from the remainder of the DVOM instrumentation module 16. The DVOM circuit preferably has a 32-kbyte buffer.

The DVOM circuit is preferably provided with overvoltage and overcurrent protection. For example, a fuse can be incorporated into the DVOM circuit.

As indicated earlier, the DVOM comprises one measurement input channel. This channel comprises one measurement input and one return input. Inputs are accessible at one multi-contact input connector of approximately 15 pins.

The measurement input channel can also be used for optional accessories, such as adapters/transducers, external shunts, attenuators, and other accessories. In this regard, transducer power is provided through the multi-contact connector. The voltages provided on the connector for powering transducers and accessories are preferably current-limited.

The input impedance of the DVOM circuit for voltage measurement functions is 10 Mohms resistive. This value was selected to minimize the DVOM load effect on the circuit under test. The input impedance for resistance measurements depends upon the selected measurement range.

As indicated earlier, electrical isolation is provided for the DVOM circuit so that the measurement input channel is electrically isolated from the remainder of the DVOM instrumentation module 16. No significant measurable current will flow, except between the measurement and return connections of the measurement channel as determined by the input impedance.

Also, as indicated earlier, the DVOM circuit comprises overvoltage and overcurrent protection. Protection is provided for the remainder of the DVOM instrumentation module 16, the motor vehicle, and the user from damage or harm due to application of voltages or currents beyond the maximum measurement ranges of the DVOM instrumentation module. When the DVOM circuit is measuring voltage, overvoltage protection clamps internal voltages while dropping excess voltage across a large value series resistance which can be less than the described input resistance. Overvoltage protection during resistance measurement draws current through a fuse and/or other current limiting device and can require replacement of an accessible fuse or other easily accessible component by the user.

The DVOM instrumentation module 16 enables measurement of voltage, resistance, and current. The DVOM circuit also provides a diode test capability, as well as a cable ID resistor capability.

Several hardware voltage and resistance ranges are provided within the overall voltage and resistance range of the DVOM instrumentation module 16 as required to meet accuracy and resolution specifications. Low level software functions permit application programs to select either fixed ranges or automatic range selection.

As indicated earlier, a user serviceable internal fuse can be provided as part of the overvoltage protection circuit during resistance measurement. Also, a user serviceable internal fuse can be provided as part of the overcurrent protection circuit during current measurement.

As also indicated earlier, the DVOM firmware is preferably stored in flash memory. This provides firmware upgrade by flash reprogramming instead of physical read only memory (ROM) replacement. The DVOM firmware is interrupt driven and manages and performs all measurement functions.

The power supply 34 can be DC powered by a fully isolated DC-to-DC converter. A battery backup pack (not shown) integrated with the power supply 34 supplies power to the power supply during powerfail conditions. An enclosure 44 of the VCI and DVOM instrumentation module 14 or 16 which houses the power supply 34 is vented to ambient air to prevent overheating.

The power supply 34 will now be described in detail. The power supply 34 is an internal DC power supply that can be externally powered from the motor vehicle.

The power supply 34 can comprise an isolated DC power input connector. The DC-to-DC converter of the power supply 34 can be fully isolated and can be connected directly across the motor vehicle battery terminals or plugged directly into a cigarette lighter receptacle. In this mode of operation, the VCI and DVOM instrumentation module isolations maintain the motor vehicle battery ground isolated from the ground of the main CPU motherboard 32. When connected to the motor vehicle, the power supply 34 uses DC power from the vehicle with an input voltage range of 7.5 volts DC to 16 volts DC.

If the motor vehicle power is lost or the VCI or DVOM instrumentation module 14 or 16 is disconnected from the vehicle, the power supply 34 operates from the backup battery pack for the power supply. The backup battery pack can be a standard rechargeable nicad backup battery pack. The rechargeable backup battery pack is integrated into the enclosure 44 of the VCI instrumentation module 14 and the DVOM instrumentation module 16.

A standard backup battery pack charging circuit (not shown) is also preferably incorporated into the enclosure 44 of the VCI instrumentation module 14 and the DVOM instrumentation module 16. The charging circuit is preferably implemented on a small printed circuit board mounted to the enclosure 44. The charging circuit only charges when the external DC input is at least 13.8 volts DC (normal running voltage of a motor vehicle) or when connected to an AC power outlet. The charging circuit preferably provides adaptive nicad charging and delivers a quick charge in less than two hours.

The power supply 34 also preferably comprises a lithium battery pack. The lithium battery pack backs up the real-time system clock/calendar and configuration random access memory (RAM) on the main CPU motherboard 32.

The DVOM software provides the required interface between the 486 microprocessor system of the main CPU motherboard 32 and the DVOM microcontroller. This library can be compatible with MS-DOS, MS-Windows, and Windows NT.

The system 10 is preferably configured to perform system self-test diagnostics that execute each time that the combined user interface and main control module 12 is powered on. The diagnostics determine the status of the personal computer system, for example, the 486 microprocessor, the RAM and ROM, the LCD controller and memory, and the IDE hard disc drive interface integrated into the combined user interface and main control module 12. The system 10 executes each of the various self tests until either a successful boot or an error occurs. If an error occurs, the user can review documentation that is provided with the system 10 to determine the appropriate action to resolve the error. If no error occurs, the system 10 boots into its normal operating mode.

In accordance with the embodiment of the invention shown in FIG. 1, all connections between the system 10 and a motor vehicle are between the vehicle and the VCI and DVOM instrumentation modules 14 and 16. Therefore, the connections between the combined user interface and main control module 12 and the motor vehicle are fully isolated.

Figure 6:
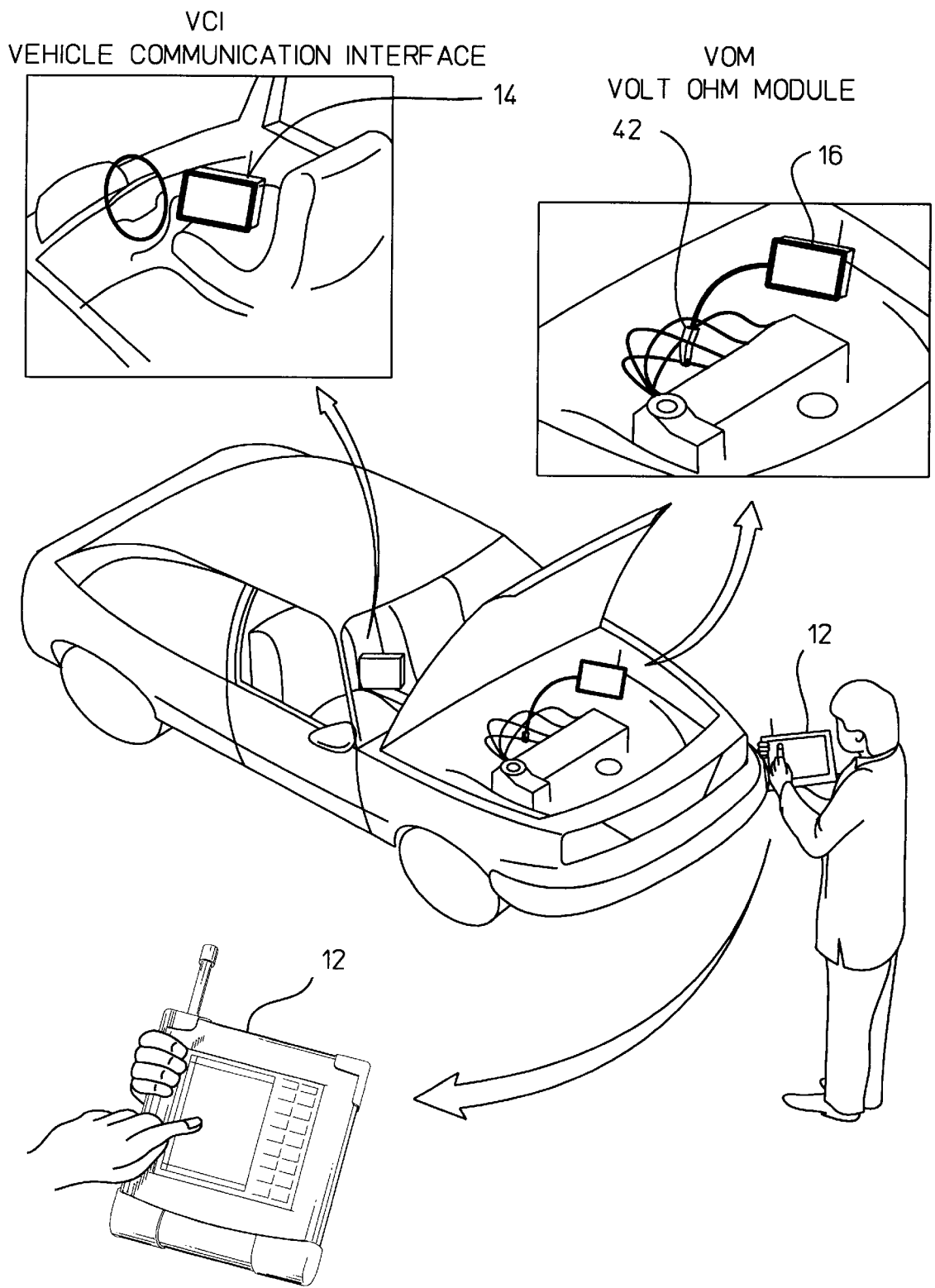
FIG. 6 illustrates an exemplary deployment of the system shown in FIG. 1.

FIG. 6 illustrates an exemplary deployment of the system 10 shown in FIG. 1. The user operates the combined user interface and main control module 12 to control the system 10. The VCI instrumentation module 14 shown in FIGS. 1, 3, and 4 is connected to the engine control module of a motor vehicle through a connector accessible through the passenger compartment of the vehicle. As shown in FIG. 6, the VCI instrumentation module 14 is on the front passenger seat of the motor vehicle. The DVOM instrumentation module 16 shown in FIGS. 1, 3, and 5 is connected to an electrical system or component of the motor vehicle through the roving probe cable assembly 42. As shown in FIG. 6, the DVOM instrumentation module 16 is in the engine compartment under the hood of the motor vehicle. The user interface and main control module 12 executes diagnostic application programs and commands the VCI instrumentation module 14 to provide status information and exercise various systems of the motor vehicle and also commands the DVOM instrumentation module 16 to perform measurements and provide measurement data. The user interface and main control module 12 also displays various information to the user.

FIG. 7 shows a modified modular wireless diagnostic, test, and information system 10' similar to the system 10 shown in FIG. 1. In FIGS. 1 and 7, like reference numerals designate corresponding elements. Therefore, only the differences between the system 10 shown in FIG. 1 and the system 10' shown in FIG. 7 will be described.

As shown in FIG. 7, the system 10' further comprises an additional remotely operated instrumentation module consisting of an interface module 46 and an engine analyzer 48. Referring to FIG. 3, the interface module 46 comprises the main CPU motherboard 32, power supply 34, RF LAN card 38, and antenna 40 common to the VCI instrumentation module 14 and the DVOM instrumentation module 16. The interface module 46 also comprises an interface, such as an RS-232 serial interface, IEEE 488 instrument interface, or other interface for connection to the engine analyzer 48. The engine analyzer 48 comprises a conventional commercially available tool commonly used in a motor vehicle service bay. The interface module 46 enables the engine analyzer 48 to be incorporated into the system 10' for remote operation by the combined user interface and main control module 12 and to provide data to the combined user interface and main control module by wireless communication.

FIG. 8 shows the modular wireless diagnostic, test, and information system 10 or 10' shown in FIG. 1 or 7, respectively, further comprising a wireless-to-wired LAN access system 50. In FIGS. 1, 7, and 8, like reference numerals designate corresponding elements. The wireless-to-wired LAN access system 50 comprises a standard commercially available product that connects the system 10 or 10' to a wired LAN. For example, the wireless-to-wired LAN access system 50 can connect the system 10 or 10' to a local dealership LAN.

Another embodiment of the modular wireless diagnostic, test, and information system in accordance with the invention, generally indicated by the numeral 10", comprises means in the form of at least one separate user interface module 52 in wireless communication with a separate main control module 54, as shown in FIG. 9. In FIGS. 1, 7, and 9, like reference numerals designate corresponding elements. Therefore, only the differences between the systems 10 and 10' shown in FIGS. 1 and 7 and the system 10" shown in FIG. 9 will be described.

The system 10" comprises at least one separate user interface module 52, the separate remotely operated main control module 54, and at least one remotely operated instrumentation module, for example, the VCI instrumentation module 14, DVOM instrumentation module 16, and interface module 46 connected by wireless communication in accordance with the invention. The system 10" is a multi-box platform configuration comprising the separate user interface module(s) 52 operated remotely from a main control module 54 and further comprising the remotely operated VCI and DVOM instrumentation modules 14 and 16 and interface module(s) 46. That is, the system 10" has the separate user interface module(s) 52 and the separate main control module 54, instead of the combined user interface and main control module 12 of the system 10 shown in FIG. 1 and the system 10' shown in FIG. 7, as well as the VCI and DVOM instrumentation modules 14 and 16 and interface module(s) 46.

As shown in FIGS. 9 and 10, the user interface module 52 integrates a screen 56, which is preferably an LCD panel, and a user input digitizer 58, such as a touchscreen input interface, in a lightweight enclosure 60. The main control module 54 integrates a standard 486 microprocessor system, a hard disc drive and other optional mass storage devices, and optional PCMCIA slots in an enclosure 62. Advantageously, the main control module 54 can be a conventional personal computer system equipped with wireless communication components.

The user interface module 52 is the handheld user interface portion of the system 10". The user interface module 52 is connected to the separate main control module 54 over a wireless communication link. Ease of use is enhanced by the separated user interface module 52 having an integrated touchscreen user input digitizer interface. As shown in FIG. 9, the user interface module 52 also communicates with the VCI and DVOM instrumentation modules 14 and 16 and the interface modules 46 by wireless communication. All cable connections to the VCI instrumentation module(s) 14, the DVOM instrumentation module(s) 16, and the interface module(s) 46 are between the instrumentation modules and the motor vehicle. This frees the user from dealing with the motor vehicle cable connections on a conventional handheld tester.

The user interface module 52 comprises a microprocessor 63, the screen 56, the user input digitizer 58 along with associated support circuitry, an audio transducer 64, a PCM-CIA RF LAN card 66, and an RF antenna 68. The user interface module 52 is preferably implemented as follows.

The screen 56 of the user interface module 52 preferably comprises a standard backlighted LCD panel. In one implementation, the screen 56 can be a passive monochrome 9.6-inch LCD panel, such as a model DMF50260NF-FW5, available from Optrex. This LCD panel has VGA-compatible resolution of 640×480 pixels. The display area is approximately 13 cm wide by 17 cm long. The LCD panel has a typical response time of 290 ms. The screen 56 is preferably edge lit with CCFT backlighting and has typical brightness of 90 nits, which is brighter than the screen of a typical laptop personal computer. The display modes include graphic, as well as text modes. For example, the screen 56 can emulate an oscilloscope display to display waveforms.

As shown in FIG. 9, the user interface module(s) 52 comprises contrast control 70. The contrast control 70 for the screen 56 comprises membrane switches that form a keypad. The membrane switches provide a limited number of keys for LCD panel contrast control. For example, the keys preferably comprise two keys, namely, "CONTRAST UP" and "CONTRAST DOWN."

The user interface module 52 also comprises the user input digitizer 58 which preferably includes a touchscreen input interface in the form of a standard finger touchscreen integrated with the screen 56. The technology used to implement the touchscreen interface is preferably a resistive touch system in which a transparent sheet contains a matrix of resistive touch input switches. The user compresses a touch switch point to cause a touch press input.

In one implementation, the user input digitizer 58 is a transparent, continuous analog, X-Y resistive touchscreen constructed using five-wire resistive technology. Approximately 65–75% of the light emitted by the screen 56 is transmitted through the touchscreen input interface.

In addition to the visual display provided by the screen 56, the user interface module 52 preferably comprises the audio transducer 64, such as a speaker. The operation of the speaker can be limited to touch clicks and error beeps that are originated by the system BIOS. For example, the speaker can be used for such purposes as key press error, parameter out of range, and other prompts, such as low battery. The programming techniques used to activate the speaker are PC-compatible.

The user interface module 52 also comprises a power supply 72 having power indicators and a backup battery pack 74. In one implementation, the user interface module 52 comprises a green "POWER ON" indicator (not shown). This indicator is incorporated into a power on/off switch (not shown) located on the user interface module 52. The power on/off switch is preferably a single-pole, single-throw rocker or toggle switch. Preferably, the power on/off switch is illuminated brightly if the power supply 72 is connected to a motor vehicle battery and less brightly if the power supply is being powered by the backup battery pack 74. Alternatively, a green light can be provided to indicate that the power supply 72 is being externally powered and the backup battery pack 74 is being recharged and an orange light when power is being supplied by the backup battery pack.

The main control module 54 can comprise a personal computer (PC) processor unit 76. The processor unit 76 includes a PC motherboard 78 connected to a power supply 80. The power supply 80 can be connected to an AC power outlet (not shown) or to an uninterruptable AC power source (not shown) connected to the power supply to supply needed power for short-term operation of the system 10" in case the external power to the processor unit 76 is interrupted or disconnected. The uninterruptable power source for the processor unit 76 is autoranging, 90 to 260 volts AC, 50 or 60 Hz input. The output to power the main control module 54 is 16 volts DC at 4.5 amperes. The power supply 80 also comprises a cooling fan 81 for preventing overheating of the processor unit 76.

The processor unit 76 further comprises a hard disc drive 82. The hard disc drive 82 is provided to store the operating system and application programs executed by a microprocessor resident on the PC motherboard 78, as well as information for display to the user. Additionally, the processor unit 76 can comprise a floppy disc drive 84 or a CD-ROM drive 86. The floppy disc drive 84 or CD-ROM drive 86 is preferably incorporated to provide mass volumes of information for access by the user. Additionally, the user interface module 52 and the main control module 54 each further comprise a user interface device driver (UIDD) 87A and 87B, respectively, to capture the user interface information from the user interface module and transmit that information to the main control module and return display and speaker information from the main control module to the user interface module.

The processor unit 76 also comprises a backplane 88 connected to the PC motherboard 78. The backplane 88 provides standard expansion slots, that will be described in more detail later.

The main control module 54 is connected by wireless communication to the user interface module(s) 52, as well as to the VCI and/or DVOM instrumentation module(s) 14 and/or 16 and/or interface module(s) 46. In one implementation of the system 10", the processor unit 76 comprises a standard RF LAN card 90, also available from PROXIM, installed in one of the PCMCIA ports of the processor unit and an RF antenna 92. The processor unit 76 can also comprise a standard LAN card (not shown) connected to a wired dealership LAN.

In an exemplary implementation of the system 10" for motor vehicle maintenance and repair, the processor unit 76 is a personal computer, AT compatible diagnostic tool. The processor unit 76 comprises standard PC-AT expansion slots for various cards, as well as to provide internal future expandability. The processor unit 76 can be implemented as follows.

The PC motherboard 78 can be a standard, PC-AT compatible printed circuit assembly in the 2/3 Baby AT form factor with integrated input/output (I/O). I/O ports on the PC motherboard 78 include Integrated Drive Electronic (IDE) hard disc, floppy disc, serial, and parallel. There is a four- or six-slot backplane 88 in the form of a board plugged vertically into the PC motherboard 78. This means that the I/O cards are mounted horizontally, that is, parallel to the PC motherboard 78. The slots on the backplane 88 are used for an optional floppy disc drive, an optional enhanced IDE CD-ROM drive, and a PCMCIA adapter. This leaves zero, one, two, or three slots open for expansion, depending upon the configuration. The serial and parallel port connectors are panel mounted. The PCMCIA slots are implemented by a controller card with the PCMCIA sockets extending from this card to the outside of the enclosure 62 of the processor unit 54.

Considered in more detail, the PC motherboard 78 of the processor unit 76 is the main system board and comprises a personal computer compatible motherboard that forms the central core of the system 10". The PC motherboard 78 provides PC-AT compatible functionality on a single printed circuit board.

The PC motherboard 78 can comprise an Intel 8086 architecture microprocessor, such as a 486 or Pentium device. For example, the microprocessor can be an SL-Enhanced 486SX which runs at a clock rate of 25 MHz, available from Intel Corporation. The SL-Enhanced 486SX microprocessor is a 32-bit internal device, with a 32-bit external address bus and a 32-bit external data bus. This microprocessor integrates eight kbyte of internal cache memory onto the chip to improve performance. The microprocessor is socketed in a PGA package and can be upgraded to any five-volt 486SX, SX2, DX, or DX2 microprocessor. For example, the microprocessor is upgradable to 66 MHz 486DX2. The PC motherboard 78 also comprises a Basic Input Output System (BIOS) EPROM.

The PC motherboard 78 also comprises on-board RAM. For example, the PC motherboard 78 can comprise four Mbyte of dynamic RAM (DRAM) extendable to 16 Mbyte. Preferably, the four Mbyte of DRAM is expandable with 72-pin SIMMS (x36) to 16 Mbyte.

As indicated earlier, the PC motherboard 78 also comprises integrated I/O ports. The I/O ports include an IDE hard disc interface, a floppy disc interface, a serial interface, and a parallel interface, as well as an external keyboard port. The PC motherboard 78 also comprises four or six standard I/O expansion slots used for an optional floppy disc card, an optional enhanced IDE CD-ROM card, a PCMCIA controller card, and one I/O slot is VEAS VL-Bus capable.

The basic configurations of the processor unit 76 can be as follows. All configurations of the system 10" include a mass storage device which is preferably the hard disc drive 82. For example, the mass storage device can be an IDE hard disc drive with a 120-Mbyte capacity. This 2.5-inch form factor hard disc drive is contained inside the enclosure 62 of the main control module 54. The hard disc drive 82 can be upgraded to the IDE limit of 540 Mbyte.

In one configuration, the processor unit 76 comprises no floppy disc drive or CD-ROM drive. In the configuration in which there is no floppy disc or CD-ROM drive, the riser of the backplane 88 has four slots with two open slots. The hard disc drive 82 is included in the configuration. The processor unit 76 also includes PCMCIA slots implemented on a PCMCIA controller card.

In another configuration, the processor unit 76 comprises the floppy disc drive 84 as another mass storage device. In the floppy disc drive configuration in which there is a floppy disc drive, the riser card of the backplane 88 has six slots with three open slots. The floppy disc drive 84 is preferably a standard 3.5 inches by one inch tall with a 1.44-Mbyte capacity and occupies the space from the sixth I/O card. The floppy disc drive 84 is connected to the floppy disc controller on the PC motherboard 78. The hard disc drive 84 is also included in the configuration. The processor unit 76 includes PCMCIA slots implemented on the PCMCIA controller card.

In yet another basic configuration, the processor unit 76 can comprise the CD-ROM drive 86 as an additional mass storage device. In the CD-ROM drive configuration, the riser card of the backplane 88 has six slots with three open slots. The CD-ROM drive is 5.25 inches by one inch tall and preferably comprises a standard enhanced IDE interface. The CD-ROM drive 86 is connected to an enhanced IDE interface plugged into one of the expansion slots. The CD-ROM drive 86 is low profile, caddyless, and has a 2× transfer rate. Both drives occupy the space from the sixth I/O card. The enhanced IDE controller card occupies one of the I/O slots. The hard disc drive 82 is included in the configuration. The processor unit 76 includes PCMCIA slots implemented on the PCMCIA controller card.

As indicated earlier, the processor unit 76 accommodates an optional PCMCIA interface. The PCMCIA interface is a PCMCIA controller card that plugs into one of the expansion slots on the backplane 88. The PCMCIA slots are preferably provided with a cover. Sockets for the PCMCIA cards are mounted on the PCMCIA controller card. The PCMCIA cards are inserted into the PCMCIA sockets on the PCMCIA controller card through the I/O card mounting bracket. The PCMCIA controller card accepts two type I/II or one type III 68-pin PCMCIA cards. The PCMCIA interface is not isolated.

The external interfaces are preferably implemented as follows. The PC motherboard 78 comprises a standard external Centronics 8-bit bi-directional interface. The processor unit 76 comprises an external Centronics parallel port which includes a Centronics parallel connector, that is, a DB25 connector, mounted to a panel incorporated into the enclosure 62 of the main control module 54 and cabled to the integrated I/O of the PC motherboard 78. The Centronics port can be used to connect the processor unit 76 to peripherals, such as a parallel printer. The Centronics parallel interface is not isolated.

In addition, the PC motherboard 78 also preferably comprises a standard external RS-232 serial interface. The processor unit 76 comprises an external RS-232 serial port which includes an RS-232 serial connector, namely, a DB9 connector, mounted to the panel incorporated into the enclosure 62 of the main control module 54 and cabled to the integrated I/O of the PC motherboard 78. The RS-232 serial port can be used to allow host communication with a peripheral, such as a serial printer. The RS-232 serial interface is not isolated.

Furthermore, the PC motherboard 78 also preferably comprises a standard external keyboard interface to connect an external standard keyboard (not shown) to the system 10". The processor unit 76 comprises an external keyboard port which includes a keyboard connector, namely, a 6-pin miniDIN connector, mounted to the PC motherboard 78 to enable connection of a standard keyboard. The external keyboard interface is not isolated.

The software for the system 10" is preferably a Windows For Workgroup (WFWG) operating environment. The WFWG is installed in both the user interface module 52 and the processor unit 76 of the main control module 54.

The mechanical configuration of the system 10" will now be described in detail. This mechanical configuration employs advanced ergonomics/industrial design technology.

As indicated earlier, the system 10" comprises the separate user interface module(s) 52 and the separate main control module 54, as shown in FIG. 9. The enclosure 60 of the user interface module 52 is preferably painted and molded in black or black grey to camouflage dirty and greasy fingerprints, since the user interface module is intended for use in a motor vehicle service bay. The enclosure 62 of the main control module 54 can be a standard mini-tower or tower case, since the main control module can be located in an office area rather than the motor vehicle service bay.

The enclosure 60 of the user interface module 52 houses the screen 56, user input digitizer 58, blacklight inverter, and interconnect wiring. The enclosure 60 is preferably constructed from thermoplastic, such as mild plastic which is durable, shock resistant, and chemical resistant. Elastomeric bumpers 94 can be provided at strategic locations on the enclosure 60 of the user interface module 52 to absorb shock from accidental drops.

One implementation of the user interface module 52 had the following mechanical specifications. The thickness of the user interface module 52 was 26 mm (1.03 inches). The user interface module 52 had a width of 281 mm (11.06 inches). The length of the user interface module 52 was 263 mm (10.35 inches). The approximate weight of the implementation of the user interface module was 2.0 pounds.

The enclosure 62 of the main control module 54 houses the PC motherboard 78, power supply 80, hard disc drive 82, floppy disc drive 84 or CD-ROM drive 86, spare 2/3 size AT slots, backplane 88, and internal brackets to secure the components. Importantly, I/O connectors are located on the main control module 54 to free the user from cables connected to peripheral devices. All connectors are standard connectors. The connectors are preferably provided with connector covers.

The enclosure 62 of the main control module 54 preferably consists of sheet metal parts that form a protective environment for the main electronics. Covers on the main control module 54 can be easily removed for service.

Preferably, cooling is provided for the user interface module 52 and the main control module 54. The enclosure 60 of the user interface module 52 is provided with cooling vents (not shown) having filters (not shown) to the ambient surroundings. The enclosure 62 of the main control module 54 includes an opening (not shown). The cooling fan 81 of the power supply 80 is mounted adjacent to the opening in the enclosure 62 to draw cooling air into the enclosure of the processor unit 76. Air is exhausted from the enclosure 62 through vents (not shown) to the ambient surroundings.

In operation, as information targeted for the user interface module 52 is received by the processor unit 76 hardware (a display controller with no real output), the UIDD 87B of the processor unit captures and transmits this information over the RF LAN to the user interface module 52, resulting in update of the screen 56 and speaker sound. The touch inputs generated by the user on the user input digitizer 58 of the user interface module 52 are captured by the UIDD 87A of the user interface module and transmitted over the RF LAN to the processor unit 76 to access information and control the functions of the processor unit.

The user interface module 52 is lightweight, handheld or armheld. Consequently, the user can easily maneuver the user interface module 52 around a motor vehicle. Also, the user can set the user interface module 52 on a work surface in a motor vehicle service bay or on the seat of a motor vehicle during a road test and interact with the user interface module with one hand, as desirable for a touchscreen- or stylus-operated computer. Any selected diagnostic application program can be downloaded from the main control module 54 to the user interface module 52 before a road test is commenced. Additionally, the user interface module 52 preferably comprises a tilt stand or hanger 96 selectively secured to the user interface module, for example, by means of a Velcro connection, so that the user interface module can be set on or hung from the hood or other features of a motor vehicle, as shown in FIG. 11.

In a contemplated modification of the system 10" shown in FIG. 12, a modified user interface module 52' can comprise a pair of glasses 98 and a head piece 100 that a user would wear, with a built-in screen 102 and microphone 104 connected to the on-board microprocessor 63 of the user interface module preferably attached to the clothing of the user or strapped to the user. The glasses 98 provide normal viewing like an ordinary pair of glasses, as well as have the built-in screen 102. This version of the user interface module 52' would free both hands of the user, since information would be viewed through the glasses 98 and the system 10" would be commanded by the user via voice commands detected by the microphone 104. The modified user interface module 52' could also be equipped with a small handheld pointing device (a mouse emulator) (not shown) to provide an interactive user interface module and a speaker (not shown) for audible feedback.

The systems 10, 10', and 10" are provided with various cables and adapters. Preferably these cables and adapters for the systems 10, 10', and 10" include the VCI cable 36, the DVOM roving probe cable assembly 42, and a battery power cable (not shown). Preferably, these cables are configured to operate in the harsh motor vehicle service bay environment. Each cable and adapter will now be briefly described.

The VCI cable 36 shown in FIG. 4 connects the VCI instrumentation module 14 to the motor vehicle diagnostic connector. The VCI cable 36 is approximately 2.5 meters long and has 20 conductors that are 24 AWG. The VCI cable 36 has an overall braided shield with 85% coverage. The outer jacket is preferably a black PVC. Each end of the VCI cable 36 is provided with molded strain relief, which is also constructed from PVC. At one end of the VCI cable 36, a standard DB9 connector with thumb locking screws is attached. A user specific diagnostic connector is connected to the other end. Both ends of the VCI cable 36 are preferably overmolded in PVC.

The DVOM roving probe cable assembly 42 shown in FIG. 5 connects the DVOM instrumentation module 16 to a desired point of measurement. The DVOM roving probe cable assembly 42 is shielded and is constructed from chemically resistant materials. The DVOM roving probe cable assembly 42 is approximately three meters long. The DVOM roving probe cable assembly 42 has a standard DB-15 connector at one end for connection to the DVOM instrumentation module 16 and probes attached at the other end for connection to various test points on a motor vehicle.

The battery power cable (not shown) connects the power supply 34 of the DVOM instrumentation module 16 to the battery of a motor vehicle. The battery power cable is approximately three meters long. The battery power cable has standard red and black battery clamps at one end. The other end of the battery power cable connects to a power jack provided with black PVC molded strain relief.

Finally, an optional cigarette lighter cable (not shown) can be provided to connect the combined user interface and main control module 12 or the power supply 72 of the separate user interface module 52 to the motor vehicle cigarette lighter receptacle. The cigarette lighter cable is approximately three meters long. The cigarette lighter cable has a power jack connector at one end to connect to the combined user interface and main control module 12 or the power supply 72 of the separate user interface module 52 and a standard cigarette lighter adapter at the other end.

The systems 10, 10', and 10" meet all requirements for electromagnetic interference, product safety, hazardous classification, and environmental testing. The systems 10, 10', and 10" conform to international requirements for safety of construction and electrical design, electromagnetic interference, electromagnetic susceptibility, acoustic noise, environmental specifications, and ergonomics. These requirements include suitability for use in a Class I hazardous environment, since the systems 10 and 10' and the separate user interface and VCI and DVOM instrumentation modules 52, 14, and 16 and the interface module 46 of the system 10" can be used in a motor vehicle service bay environment. The systems 10, 10', and 10" also comply with international requirements for electromagnetic emissions and immunity performance, such as FCC Level A and EN55022 1988 (CISPR22) Class 1 requirements. Since the enclosure 60 of the user interface module 52 consists of thermoplastic, supplemental treatment of the interior surface of the enclosure to provide shielding is included in order to comply with the requirements. Since the enclosure 62 of the main control module 54 is constructed from metallic materials, due to the conductive properties of these materials, supplemental treatment is not typically necessary. Gaskets can be provided if compliance testing proves that they are needed.

A particularly advantageous application of the systems 10, 10' and 10" is motor vehicle maintenance and repair, as more particularly shown in FIGS. 6 and 11. Information presentation is key, as well as diagnostics. The mass storage device(s) integrated into the combined user interface and main control module 12 or the main control module 54 store information. These mass storage devices provide a technical database comprised of stored information records comprising a structured electronic library with hypertext links. Consequently, there is migration capability between related records to provide selective access to particular portions of information within the database. Moreover, there is also access to measurement data acquired by the measurement instrumentation, such as DVOM measurement data.

Wireless communication eliminates costly cables and improves ergonomic design. Since the systems 10, 10', and 10" are divided into modules, the systems have an excellent ergonomic design due to the smaller and lighter units, provide increased ease of use, and result in a more rugged product. Also, a complete system 10, 10', or 10" could consist of one or more instrumentation modules 14, 16, and 46. Moreover, a plurality of DVOM instrumentation modules 16 and interface modules 46 having instruments can be used with a single VCI instrumentation module 14 and user interface module 12, 52, or 52' to conduct more sophisticated diagnostics with multiple measurement channels. This provides a more functionally flexible product and a more scalable product from a cost standpoint.

All instrumentation modules 14, 16, and 46 have an identical wireless communication and processor platform. This reduces the overall cost of each module, resulting in a lower overall system cost. Power and ground isolation issues associated with connecting to a motor vehicle are substantially eliminated.

The system 10" separates the main processor unit from the portable and size-sensitive elements of the system. This provides for ease of upgrade and ability to leverage off-the-shelf components.

The systems 10, 10', and 10" facilitate customer service of a motor vehicle. The systems 10, 10', and 10" provide various advantages, such as reduced service time, improved fault identification, and better parts utilization. The systems 10, 10', and 10" enable reduced overall warranty costs.

The systems 10, 10', and 10" also permit motor vehicle manufacturers access to information directly from dealers and customers. The systems 10, 10', and 10" provide an opportunity to collect service feedback and marketing information. Service trends can be detected early, so design changes can be made quickly to minimize cost impact to the motor vehicle manufacturer. Marketing information can be collected to obtain customer profiles and demographics or to determine when the customer might be ready to purchase a new motor vehicle.

It will be understood that the embodiments of the present invention described above are susceptible to various modifications, changes, and adaptations. For example, the combined user interface and main control module 12 shown in FIG. 1 can alternatively comprise a touchscreen interface to emulate the pen-based user input digitizer 20. The instrumentation modules 14, 16, and 46 can additionally comprise visual and/or audible indicators to indicate operational status. Since the VCI instrumentation module 14 is connected to the remainder of the system 10, 10', or 10" by the RF LAN and is therefore electrically isolated, the power supply 34 for the VCI instrumentation module is not required to be an isolated power supply. Although the system 10' incorporates the engine analyzer 48, the interface module 46 can be configured to connect any desired device to the RF LAN of the system 10'. For example, the interface module 46 provides future expandability, such as incorporation of a CAN/VAN interface. Additionally, in one contemplated modification, the system 10" has the option of including an active matrix, 9.6-inch color LCD panel as the screen 56. However, the resulting user interface module 52 would be thicker. Furthermore, the user input digitizer 58 of the separate user interface module 52 can be a pen-based magnetic or resistive grid instead of a touchscreen interface. Also, the PC motherboard 78 can further comprise a standard external VGA interface to connect an external display (not shown) to the system 10". Although the various embodiments of the system in accordance with the invention are particularly advantageous for motor vehicle service, the system may also be applicable to non-motor-vehicle environments. It is also contemplated that the system in accordance with the invention can be generalized to access information necessary to assist other service providers (such as equipment operators, doctors, and others) in providing services. All is intended to be comprehended within the meaning and range of equivalents of the appended claims.

What is claimed is:

1. An automobile diagnosis apparatus, comprising:
   a control mechanism that accepts user input and provides information for use in diagnosis of an automobile engine;
   a first instrumentation module detachably connected to a first position of the automobile engine and receiving a first set of data from the automobile engine, including
      a first wireless communication mechanism that receives instructions from the control mechanism and that transmits information for use in diagnosis of the automobile engine to the control mechanism; and
   a second instrumentation module detachably connected to a second position of the automobile engine and receiving a second set of data from the automobile engine, including:
  a second wireless communication mechanism that receives instructions from the control mechanism and that transmits information for use in diagnosis of the automobile engine to the control mechanism;
  the control mechanism including a third wireless communication mechanism that enables the control mechanism to communicate directly with each instrumentation module, the control mechanism transmitting instructions in response to the user input to at least one of the instrumentation modules and receiving from the instrumentation module, information in response to the instructions for use in the diagnosis of the automobile engine;
  wherein the first set of data and the second set of data differ.

2. The apparatus of claim 1,
the control mechanism including:
  a integrated user interface module; and
  a control module that obtains from at least one of the instrumentation modules information for use in diagnosis of an automobile.

3. The apparatus of claim 2,
wherein the control module is physically detached from the integrated user interface module.

4. The apparatus of claim 3,
the control module including a wireless communication mechanism to communicate with the integrated user interface module; and
the integrated user interface module including a wireless communication mechanism to communicate with the control module.

5. The apparatus of claim 3,
wherein the integrated user interface module is a hand-held device.

6. The apparatus of claim 2,
the control mechanism including a mount mechanism that enables the control mechanism to be detachably mounted to the automobile.

7. The apparatus of claim 6,
the mount mechanism including a tilt stand.

8. The apparatus of claim 6,
the mount mechanism including a hanger.

9. The apparatus of claim 2,
wherein the integrated user interface module is a hand-free device.

10. The apparatus of claim 1,
the control mechanism including a control module that obtains, from at least one of the instrumentation modules information for use in diagnosis of the automobile and a voice-activated communication mechanism that enables communication with the control module.

11. The apparatus of claim 2,
wherein the control mechanism is a hand-held device.

12. The apparatus of claim 1, including:
a first connector that detachably connects the first instrumentation module to an engine control module.

13. The apparatus of claim 1, including:
a second connector that detachably connects the second instrumentation module to an electrical component of the automobile engine.

14. The apparatus of claim 1,
wherein the first instrumentation module is a vehicle communication interface instrumentation module.

15. The apparatus of claim 1,
wherein the second instrumentation module is a digital volt-ohm meter instrumentation module.

16. The apparatus of claim 1,
a third instrumentation module, including:
  an engine analyzer connected to the automobile;
  an interface module connected to the engine analyzer and the control mechanism, the interface module including:
    a wireless communication mechanism that enables communication with the control mechanism.

17. The apparatus of claim 1, further comprising:
a network access mechanism that links the control mechanism to a communication link.

18. The apparatus of claim 17,
the network access mechanism including:
  a wireless communication mechanism that enables communication between the network access mechanism and the control mechanism; and
  a network interface that enables communication between the network access mechanism and the communication link.

19. The apparatus of claim 1, further comprising:
a wireless-to-wired LAN access system that enables wireless communication to the control mechanism and wired communication to a LAN.

20. A computer readable storage medium for use in an automotive diagnosis computer system, comprising:
  a first executable module including instructions that enable the computer system to accept user input and to display information;
  a second executable module that enables wireless communication to a plurality of instrumentation modules, each instrumentation module coupled to a select position of the automobile engine and for obtaining a distinct set of data from the automobile engine, the second executable module including instructions that transmit directives to at least one of the instrumentation modules and that receives a distinct set of data from the instrumentation module in response to the transmitted directives; and
  a third executable module including instructions that generate the directives in response to the user input and which selects at least one instrumentation module to provide information in response to the directives.

21. The apparatus of claim 20,
a repository of technical data for use by the computer system in the diagnosis of an automobile.

22. The apparatus of claim 20,
a plurality of diagnostic routines for use by the computer system in the diagnosis of an automobile.

23. The apparatus of claim 20,
wherein the third executable module is an application program used to perform specified functions for use in the diagnosis of an automobile.

24. A method for automotive diagnosis, the method comprising the steps of:
  providing a first wireless communication link to a first instrumentation module detachable coupled to a first position of the automobile engine;
  providing a second wireless communication link to a second instrumentation module detachable coupled to a second position of the automobile engine;

retrieving a first set of data from the first instrumentation module; and obtaining a second set of data from the second instrumentation, the second set of data differing from the first set of data.

25. The method of claim 24, providing a technical information database;

accessing the technical information database for information in response to the user input; and displaying the accessed information to the user.

26. The method of claim 24, including the step of:

before the retrieving step, transmitting a first set of instructions to the first instrumentation module to obtain the first set of data.

27. The method of claim 24, including the step of:

before the obtaining step, transmitting a second set of instructions to the second instrumentation module to obtain the second set of data.

* * * * *

UNITED STATES PATENT AND TRADEMARK OFFICE
CERTIFICATE OF CORRECTION

PATENT NO. : 5,884,202
DATED : March 16, 1999
INVENTOR(S) : Hossein Arjomand

It is certified that error appears in the above-identified patent and that said Letters Patent is hereby corrected as shown below:

In the drawings, Fig. 1, the term "VOM" referred to by reference numeral 16 should read "DVOM";

In the drawings, Fig. 3, the term "COSTUMIZED" should be replaced with the term "CUSTOMIZED";

In the drawings, Fig. 3, the term "VOM' should be replaced with the term "DVOM";

In the drawings, Fig. 6, the term "VOM" referred to by reference numeral 42 should read "DVOM";

In the drawings, Fig. 6, the word "DIGITAL" should precede the term "VOLT OHM METER" used by reference numeral 42;

In the drawings, Fig. 7, the term "VOM" referred to by reference numeral 16 should read "DVOM";

In the drawings, Fig. 8, the term "VOM" referred to by reference numeral 16 should read "DVOM";

In the drawings, Fig. 9, the term "VOM" referred to by reference numeral 16 should read "DVOM";

In the drawings, Fig. 10, the reference numeral 87B should be applied to the outer box also labeled 76;

In the drawings, Fig. 10, the reference numeral "76" should be replaced with the reference numeral "66";

UNITED STATES PATENT AND TRADEMARK OFFICE
CERTIFICATE OF CORRECTION

PATENT NO. : 5,884,202

DATED : March 16, 1999

INVENTOR(S) : Hossein Arjomand

It is certified that error appears in the above-identified patent and that said Letters Patent is hereby corrected as shown below:

In the drawings, Fig. 10, the term "COMPUTER" should be replaced with the term "POWER SUPPLY";

In the drawings, Fig. 10, the term "BACKUP BATTERY PACK" should be inserted into the box referred to by reference numeral 74; and In the drawings, Fig. 10, the term "MICROPROCESSOR" should be inserted into the box referred to by reference numeral 63.

UNITED STATES PATENT AND TRADEMARK OFFICE
CERTIFICATE OF CORRECTION

PATENT NO. : 5884202
DATED : March 16, 1999
INVENTOR(S) : Hossein Arjomand

Page 3 of 4

It is certified that error appears in the above-identified patent and that said Letters Patent is hereby corrected as shown below: On the title page: Item [56]

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | 5 | 3 | 0 | 9 | 3 | 5 | 1 | May 3, 1994 | McCain, et al. | | | |
| | 4 | 8 | 6 | 0 | 9 | 0 | 1 | Aug. 29, 1989 | Hochreuther, et al. | | | |
| | | | | | | | | | | | | |
| | | | | | | | | | | | | |
| | | | | | | | | | | | | |
| | | | | | | | | | | | | |
| | | | | | | | | | | | | |
| | | | | | | | | | | | | |

UNITED STATES PATENT AND TRADEMARK OFFICE
CERTIFICATE OF CORRECTION

PATENT NO. : 5,884,202
DATED : March 16, 1999
INVENTOR(S) : Hossein Arjomand

It is certified that error appears in the above-identified patent and that said Letters Patent is hereby corrected as shown below:

FOREIGN PATENT OR PUBLISHED FOREIGN PATENT APPLICATION

| | | | | DOCUMENT NUMBER | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|---|
| | | 0 | 4 | 1 | 9 | 7 | 5 | 5 | A1 | 3 April 91 | | | | | |
| | | 0 | 3 | 8 | 3 | 5 | 9 | 3 | A | 22 Aug. 90 | | | | | |
| | | | | | | | | | | | | | | | |
| | | | | | | | | | | | | | | | |
| | | | | | | | | | | | | | | | |
| | | | | | | | | | | | | | | | |
| | | | | | | | | | | | | | | | |
| | | | | | | | | | | | | | | | |

Signed and Sealed this

First Day of February, 2000

Attest:

Q. TODD DICKINSON

Attesting Officer

Acting Commissioner of Patents and Trademarks